US009423426B1

(12) United States Patent
Chelmins et al.

(10) Patent No.: US 9,423,426 B1
(45) Date of Patent: Aug. 23, 2016

(54) SAMPLING AND CONTROL CIRCUIT BOARD FOR AN INERTIAL MEASUREMENT UNIT

(75) Inventors: David T Chelmins, Olmsted Falls, OH (US); Richard T. Powis, Jr., Parma, OH (US); Obed Sands, Avon Lake, OH (US)

(73) Assignee: The United States of America as Represented by the Administrator of National Aeronautics and Space Administration, Washington, DC (US)

(*) Notice: Subject to any disclaimer, the term of this patent is extended or adjusted under 35 U.S.C. 154(b) by 931 days.

(21) Appl. No.: 13/565,890

(22) Filed: Aug. 3, 2012

(51) Int. Cl.
*G01D 21/00* (2006.01)
*G01R 13/02* (2006.01)

(52) U.S. Cl.
CPC .................................. *G01R 13/0254* (2013.01)

(58) Field of Classification Search
CPC .. G01C 19/5607; G06F 19/00; H03D 1/2254; H03D 3/006; H03D 3/007; H03L 7/0991
See application file for complete search history.

(56) References Cited

U.S. PATENT DOCUMENTS

| 6,127,970 | A | 10/2000 | Lin |
| 6,311,129 | B1 | 10/2001 | Lin |
| 6,415,223 | B1* | 7/2002 | Lin et al. ..................... 701/431 |
| 6,449,559 | B2 | 9/2002 | Lin |
| 6,658,354 | B2* | 12/2003 | Lin ............................... 701/454 |
| 7,406,379 | B2 | 7/2008 | Volk et al. |
| 7,907,838 | B2 | 3/2011 | Nasiri et al. |
| 2005/0256637 | A1 | 11/2005 | Tazartes et al. |
| 2009/0143923 | A1 | 6/2009 | Breed |
| 2009/0326851 | A1 | 12/2009 | Tanenhaus |
| 2011/0215952 | A1 | 9/2011 | Aria et al. |

* cited by examiner

*Primary Examiner* — Elias Desta
(74) *Attorney, Agent, or Firm* — Robert H. Earp, III

(57) ABSTRACT

A circuit board that serves as a control and sampling interface to an inertial measurement unit ("IMU") is provided. The circuit board is also configured to interface with a local oscillator and an external trigger pulse. The circuit board is further configured to receive the external trigger pulse from an external source that time aligns the local oscillator and initiates sampling of the inertial measurement device for data at precise time intervals based on pulses from the local oscillator. The sampled data may be synchronized by the circuit board with other sensors of a navigation system via the trigger pulse.

20 Claims, 12 Drawing Sheets

FIG. 7

Example of Request Timing for One Dataset

Each block is 16 bits and each column is aligned in time.

From microcontroller to IMU (request register reads)

| -- | Gx? | Gy? | Gz? | Ax? | Ay? | Az? | Tx? | Tx? | -- | -- |
|---|---|---|---|---|---|---|---|---|---|---|

From IMU to microcontroller (response)

| -- | XX | Gx | Gy | Gz | Ax | Ay | Az | Tx | -- | -- |
|---|---|---|---|---|---|---|---|---|---|---|

From microcontroller to navigation processor

| HDR | -- | Gx | Gy | Gz | Ax | Ay | Az | Tx | -- | -- |
|---|---|---|---|---|---|---|---|---|---|---|

*Key: HDR = 0xBEEF or 0xBEDE; G = gyroscope, A = accelerometer, T = temperature, -- = idle*

700

SAMPLING AND CONTROL CIRCUIT BOARD FOR AN INERTIAL MEASUREMENT UNIT

ORIGIN OF THE INVENTION

The invention described herein was made by employees of the United States Government and may be manufactured and used by or for the Government for Government purposes without the payment of any royalties thereon or therefore.

The invention described herein was also made in the performance of work under a NASA contract and is subject to the provisions of Section 305 of the National Aeronautics and Space Action of 1958, Public Law 85-568 (72 Stat. 435; 42 U.S.C. 2457).

FIELD

The present invention generally pertains to circuits, and more specifically, to a circuit board that serves as a control and sampling interface to an Inertial Measurement Unit ("IMU") and is closely synchronized with other sensors.

BACKGROUND

Certain electronic devices may track position for various terrestrial and space applications. Such devices include Global Positioning Systems ("GPS") and IMUs. IMU measurements are qualitatively different from radiometric measurements used by systems such as GPS. GPS uses time of flight, whereas IMUs measure acceleration and changes in angle (i.e., inertial measurements) via mechanisms such as accelerometers measuring load cells, spring displacements, etc. The inertial measurements are intrinsic to the physics of the body they are on, whereas radiometric measurements are used to calculate position mathematically as legs of a triangle.

IMUs may be particularly beneficial in navigation systems where it is not possible to use an external navigation source, such as GPS, for a period of time. For example, for spacesuit navigation on the lunar surface, GPS is generally not usable because the moon currently lacks a network of satellites required to effectively facilitate GPS. Four satellites are required to determine horizontal position and height (i.e., location in three dimensions), as well as receiver clock offset.

However, to be most effective and simple to integrate into an overall navigation system consisting of many sensors, IMU data generally should be closely synchronized in time to other sensors in the system, such as GPS or other radiometric measurements when available. This generally requires a precise time-stamp technique as well as external synchronization pulse triggering. Conventional systems are stand-alone IMU applications that often rely on GPS as a time stamping device rather than on a triggering mechanism to synchronize collection of IMU data. The high drift rates of Micro-Electromechanical System ("MEMS") IMUs, or the inclusion of gravity sensors to correct the drift, make these stand-alone solutions particularly impractical for various applications, such as studying lunar surface navigation. Accordingly, an IMU system that can effectively synchronize with other system sensors without relying solely on time stamping may be beneficial.

SUMMARY

Certain embodiments of the present invention may be implemented and provide solutions to the problems and needs in the art that have not yet been fully solved by conventional position measurement systems. For example, certain embodiments of the present invention include a circuit board that serves as a control and sampling interface to an IMU. The circuit board may provide sampling and communication abilities that allow the IMU to be sampled at precise time intervals based on an external trigger pulse, which enables various navigation sensors to be synchronized closely in time. The data may be minimally processed onboard and returned to a separate processor for inclusion in an overall system (e.g., for lunar surface navigation). The circuit board may allow the normal overhead associated with IMU data collection and timing to be performed outside of the system processor, freeing up time to run more intensive algorithms in parallel. Such embodiments may include the circuit schematic, board layout, and microcontroller firmware for the IMU sampling and control circuit board.

In one embodiment of the present invention, an apparatus includes a circuit board configured to interface with an inertial measurement device, a local oscillator, and an external trigger pulse. The circuit board is configured to receive the external trigger pulse that time aligns the local oscillator and initiates sampling of the inertial measurement device for data at precise time intervals based on pulses from the local oscillator. The sampled data is synchronized by the circuit board with other sensors of a navigation system via the external trigger pulse.

In another embodiment of the present invention, an apparatus includes a circuit board configured to interface with an inertial measurement device, a local oscillator, and an external trigger pulse. The circuit board is configured to receive the external trigger pulse that time aligns the local oscillator. The circuit board is also configured to sample the inertial measurement device for data at time intervals based on pulses from the oscillator.

In yet another embodiment of the present invention, a system includes an inertial measurement unit, a local oscillator, and a main processor. The system also includes a circuit board configured to interface with the inertial measurement unit, the oscillator, an external trigger pulse, and the main processor. The circuit board is configured to receive the external trigger pulse that time aligns the local oscillator. The circuit board is also configured to sample the inertial measurement device for data at time intervals based on pulses from the oscillator. The sampled data is synchronized by the circuit board with other sensors of a navigation system via the trigger pulse. The main processor is configured to perform intensive processing for the navigation system.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIG. 7 illustrates example request and response timing for an example communication exchange between an IMU and a microcontroller, according to an embodiment of the present invention.

DETAILED DESCRIPTION OF THE EMBODIMENTS

Figure 1:
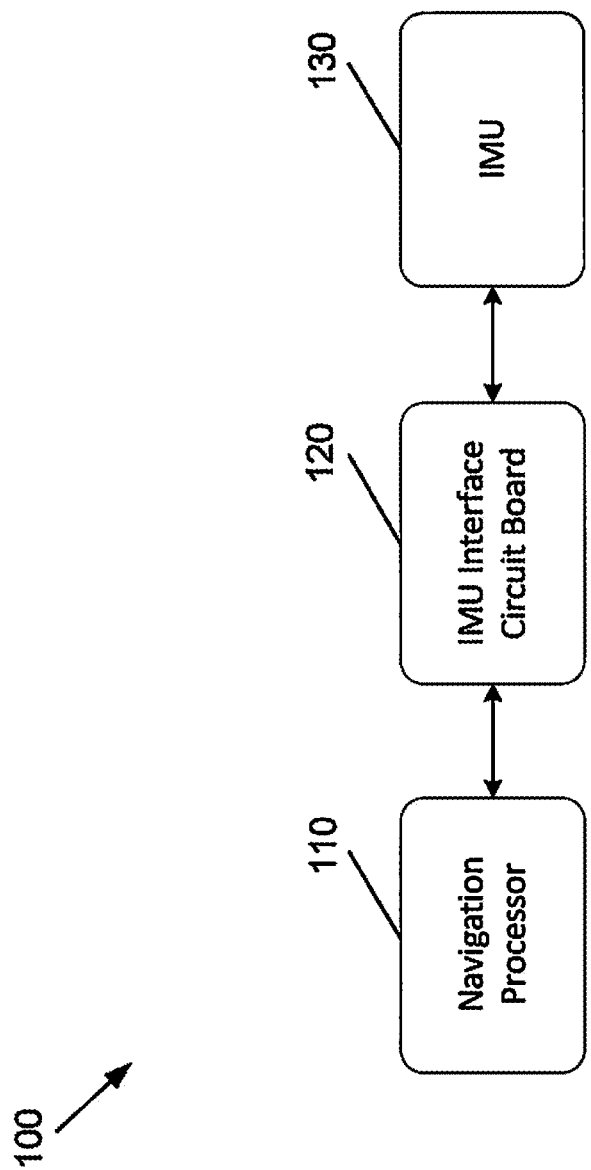
FIG. 1 illustrates a block diagram of a system interface, according to an embodiment of the present invention.

Some embodiments of the present invention facilitate more effective time synchronization of an inertial device with other navigation system devices. One or more IMUs, such as microelectromechanical systems ("MEMS") IMUs, may be used to supplement a radiometric infrastructure, such as GPS. When synchronizing with a radiometric system, a time stamp is periodically received. The radiometric system can often provide a synchronization pulse or time stamp that represents a given instant in time when the radiometric navigation information was transmitted or processed by the system or local radiometric receiver. For instance, for GPS, the time stamp may be received at a rate of 1 pulse per second ("PPS").

However, the frequency with which the time stamp is received, as well as whether or not it is received periodically or irregularly, are matters of design choice depending on the radiometric device. In between receiving these time stamps, and when such a time stamp is unavailable, clock drift may occur between the inertial device and other devices in the navigation system, such as a radiometric device. For instance, in some embodiments, 1024 inertial measurements or more may be received from the inertial device between each GPS PPS signal. This may create many time synchronization issues when computing an overall navigation solution using an algorithm that includes sensor data from the inertial device, the radiometric device, or any other type of navigational device.

Some embodiments assume that the frequency and time drift of the local oscillator between PPS signals is relatively small as compared to the frequency and time drift over longer periods of time. For example, if the system was synchronized at t=0 and then no synchronization was performed over 1 hour, the clock drift could be quite large, depending on the stability of the local oscillator. In some embodiments, the system is resynchronized every second (1 PPS), coordinated with the synchronization pulse or signal from the radiometric navigation system, which prevents significant drift from accumulating. The synchronization pulse or signal can represent the point in time when a radiometric signal was transmitted, the point in time when a radiometric navigation solution was computed, or any other point in time that is synchronous to the operation of the radiometric navigation system. While the period of 1 PPS is discussed here for resynchronization, any desired resynchronization period, or variable times between resynchronizations, depending on the design of the radiometric system, may be used in certain embodiments.

In order to compensate for these time synchronization issues, some embodiments compensate for clock differences between the radiometric system and the IMU circuit board. This is measurement time bias. Measurement time bias can be reduced by periodically time aligning the IMU circuit board oscillator. When an external trigger pulse is received from the radiometric navigation system, the external trigger pulse causes the local oscillator to reset the IMU sampling operation. The local oscillator controls sampling of the IMU at a fixed rate between external trigger pulses, and the local oscillator is periodically time aligned to the radiometric navigation system whenever the external trigger pulse is received. By effectively compensating for measurement time bias, time synchronization issues between the IMU and other navigation system sensors may be resolved for at least a certain period of time between external trigger pulses.

GPS, as a radiometric navigation system, typically has 1 PPS, but an advantage of IMUs is that more rapid updates are received since the data can be sampled many times per second. This gives better understanding of a body in motion, particularly if the body is moving and/or changing direction rapidly. Using many embodiments, it is possible to know within a small degree of error that the IMU is synchronized in time with the radiometric navigation system, for instance, between time stamps. Although GPS is not available for space applications outside of the near vicinity of the Earth, the same triggering concept can be applied to other radiometric navigation systems.

Time stamping is a different way of achieving a similar effect. Time stamping is the process of marking the point in time that a measurement is received, from the reference frame of some local oscillator or time keeping device. When a system is distributed across several devices with different local oscillators, such as in the case of an IMU circuit board and a separate radiometric receiver board, time stamping may be infeasible if the drift between the oscillators is not known. Time stamping requires significant processing resources to perform later time alignment of measurements. Many low power microcontrollers lack processing resources to spare for such calculations. For example, performing floating point operations using software is relatively time consuming. However, these resources are not needed for triggered data collections, as provided by many embodiments of the present invention, since the trigger allows the system to collect data at the same time across many sensors, within a small degree of error.

The local oscillator stability can be characterized between PPS pulses to provide evidence of this degree of time and frequency drift error. Furthermore, if there is a loss of the radiometric signal, operational redundancy is provided since the local oscillator can freewheel for a period of time with a known degree of accuracy using some embodiments. This allows different embodiments to be applied to extraterrestrial surface navigation where a radiometric signal may only be available on a limited basis, situations where a radiometric external trigger signal is blocked, such as inside certain buildings or urban canyons, etc.

An oscillator is used to keep time stable between GPS trigger pulses in many embodiments. In other words, the trigger pulse may be driven at a slower rate by a satellite oscillator and the local oscillator may provide higher rate sampling operations than the satellite signal. Alternatively, the local oscillator may operate at a slower rate or at the same rate as the radiometric trigger, as may be needed by some embodiments.

For example, a system that is triggered by a 1 PPS external trigger may provide alignment of the local oscillator such that the local oscillator begins counting at the instant the external trigger is received. The local oscillator generally runs at a high rate (e.g., 20 MHz) and can drive a phase-locked loop circuit to provide a medium sampling rate suitable for the IMU (e.g., 500 Hz). The mechanism of operation may allow the 1 PPS signal to align the local oscillator and allow the local oscillator to freewheel in the interim between 1 PPS signals. As such, the accuracy of the data acquisition time alignment is a function of the drift of the local oscillator between PPS signals. This is, in general, still better than allowing the local oscillator to freewheel without input from the radiometric trigger since the systems are still aligned within some degree of accuracy. The IMU circuit board can also be wirelessly placed at a distance from the acquisition system in some embodiments. In this case, the radio transmission delay between the radiometric trigger signal and the circuit board radio receiver location should be taken into account.

FIG. 1 illustrates a block diagram of a system interface 100, according to an embodiment of the present invention. System interface 100 includes a navigation processor 110, an IMU interface circuit board 120, and an IMU 130. An external oscillator (not shown) may be used by IMU interface circuit board 120 to make timing relatively stable in the presence of temperature variation. Data may be transferred via USB, Bluetooth, or any other data transfer technology that supports efficient data flow and preferably eliminates the need for several data wires.

An enhanced command interface may allow navigation processor 110 to request data from IMU interface circuit board 120 as single samples, blocks, or a stream. In addition, IMU interface circuit board 120 may accept an input as an external trigger pulse that may be used to coordinate sampling with the rest of the system. For example, the input may be sent at a rate of 1 PPS. The 1 PPS signal, combined with a more stable oscillator, may yield a useful data set that can be synchronized with other sensors for post-processing.

Figure 2:
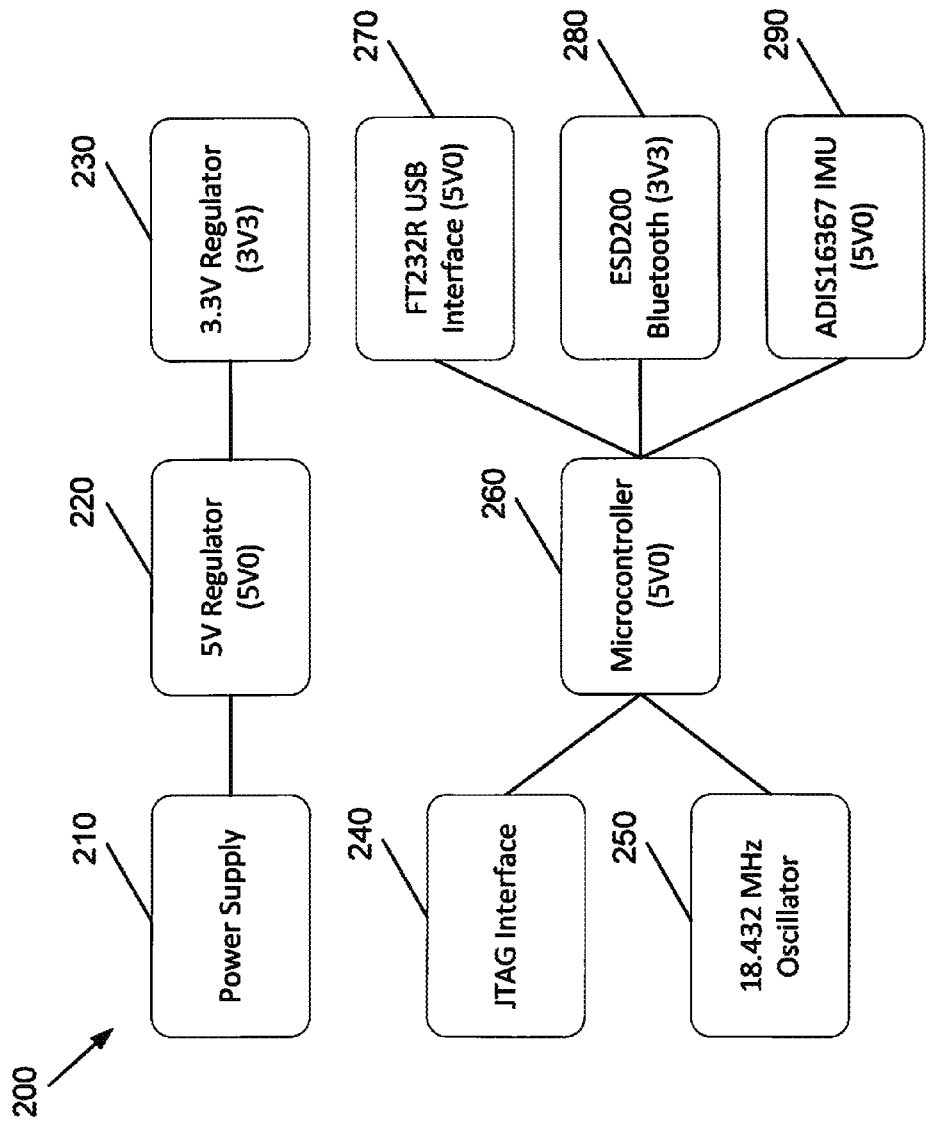
FIG. 2 illustrates a block diagram of an IMU interface circuit board, according to an embodiment of the present invention.

FIG. 2 illustrates a block diagram of an IMU interface circuit board 200, according to an embodiment of the present invention. In some embodiments, IMU interface circuit board 200 may be IMU interface circuit board 100 of FIG. 1. IMU interface circuit board 200 includes a power supply 210, and is powered primarily off of a 5V DC regulator 210, which also supplies a 3.3V DC regulator 220 for Bluetooth module 280.

In this embodiment, IMU interface circuit board 200 is configured to interface with, for example, a MEMS Analog Devices ADIS16364™ IMU 290. It should be appreciated that IMU interface circuit board 200 may be configured to interface with other similar devices. IMU 290 is configured to provide six degrees of freedom using a tri-axis gyroscope and tri-axis accelerometer. The gyroscope sensitivity may be selectable at 75, 150, or 300 degrees-per-second, and the accelerometer may support a range of +/−5 g of acceleration. IMU 290 provides data communication over a Serial Peripheral Interface ("SPI"), making IMU interface circuit board 200 generally compatible with similar models of Analog Devices IMUs by simply changing scale factors in this embodiment.

Microcontroller

In this embodiment, microcontroller 260 is a Freescale MC9S08SH32™ microcontroller. This is an 8-bit microcontroller with 32 kB of flash memory and 1 kilobyte of Random Access Memory ("RAM"). Microcontroller 260 provides two Timer Peripheral Modules ("TPMs"), a SPI module, and a Serial Communications Interface ("SCI") module. IMU interface circuit board 200 uses the 20-TSSOP package type in this embodiment.

Off-Board Communications

In this embodiment, off-board communications support is handled by a FTD FT232R™ USB-UART interface 270 or a Parani ESD200™ Bluetooth adapter 280. Both devices interface with the SCI module of microcontroller 260 and provide communication at 115200 baud. IMU interface circuit board 200 provides a Dual In-line Package ("DIP") switch that allows selection of the desired output device. Serial Transistor-Transistor Logic ("TTL") communication is also available through test ports, such as Joint Test Action Group ("JTAG") interface 240.

Oscillator

A CB3-3I-18M4320™ oscillator 250 operates at 18.432 MHz and provides 50 parts-per-million (ppm) stability to the clock of microcontroller 260. This particular frequency was chosen in this embodiment since the frequency is less than the maximum bus frequency (20 MHz) of microcontroller 260 and an integer multiple of 115200 baud (when multiplied by 160). The oscillator ppm accuracy translates to a frequency variation of +/−461 Hz on the processor bus (9.216 MHz), 6 Hz at the SCI module (115.2 kHz), and 77 Hz at the SPI clock (1.536 MHz).

Figure 3:
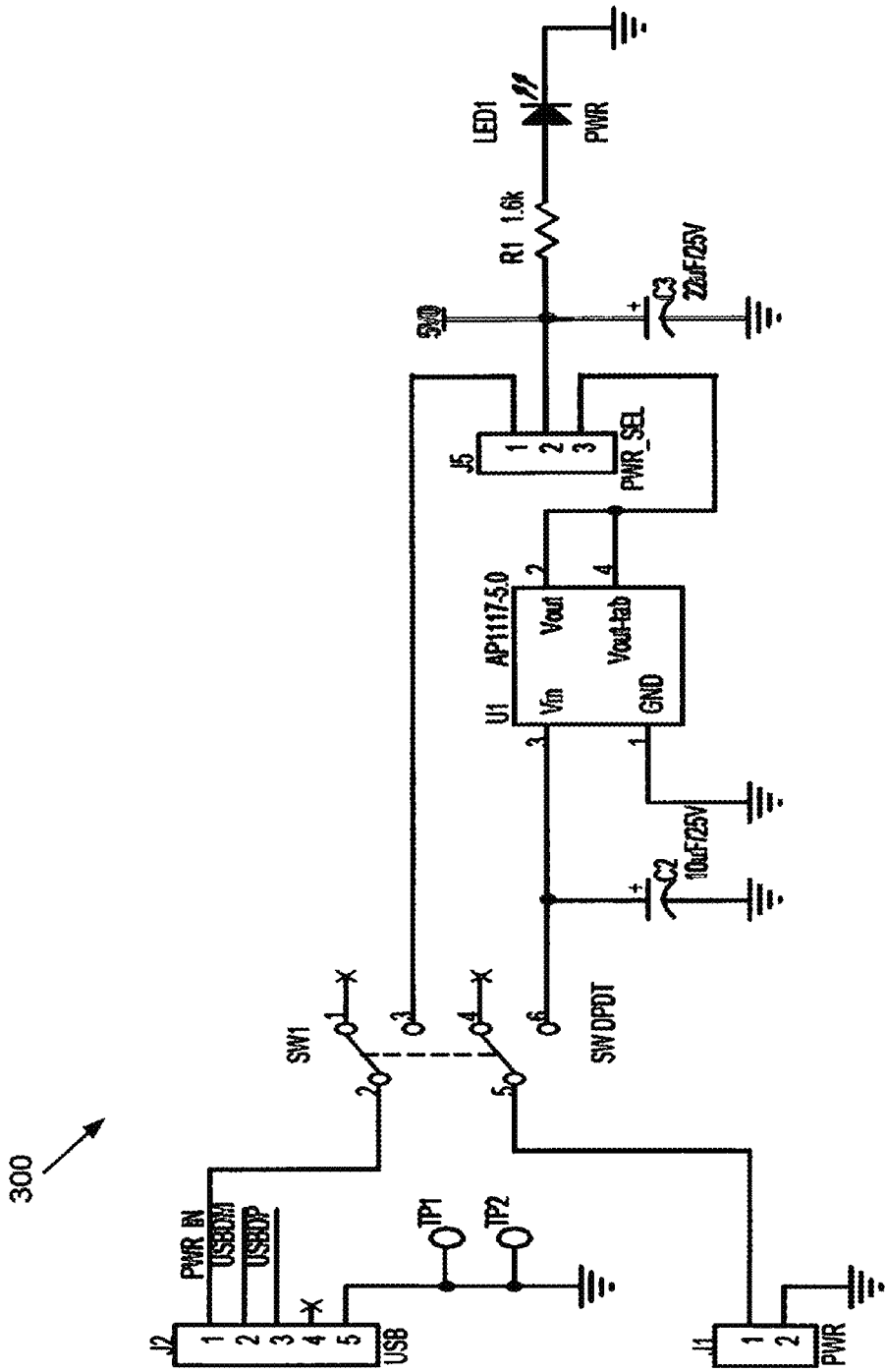
FIG. 3 illustrates a circuit schematic of a board external power interface, according to an embodiment of the present invention.

FIG. 3 illustrates a circuit schematic of a board external power interface 300, according to an embodiment of the present invention. Jumper J5 selects between an off-board power line J1, which is regulated to 5 volts direct current ("VDC") by U1, or power is provided through the USB interface J2, which is regulated according to specification. The fully operational board may consume 0.56 Watts in USB mode versus 0.98 Watts is Bluetooth mode. At 5 VDC, this is about 110 milliamps (mA) or 200 mA, respectively.

Figure 4:
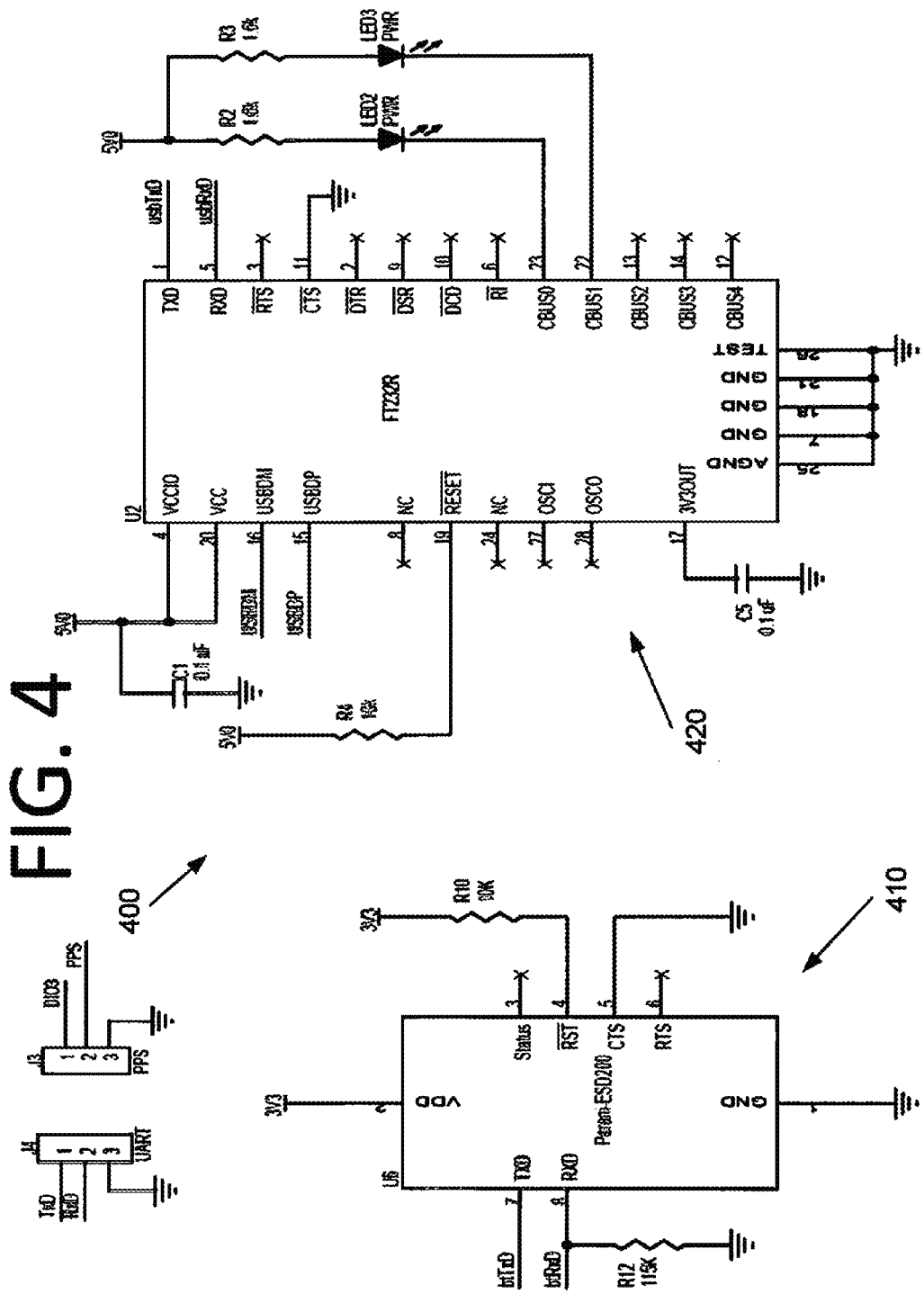
FIG. 4 illustrates a circuit schematic of external communication interfaces, according to an embodiment of the present invention.

FIG. 4 illustrates a circuit schematic of external communication interfaces 400, according to an embodiment of the present invention. Both the ESD200 Bluetooth module 410 and the FT232R USB module 420 require few supporting components. Interface J3 receives a 1 PPS trigger and associated ground cable, while providing an extra DIO3 pin for future expansion or triggering. Data transfer can take place using the TTL interface J4, which interfaces directly with the microcontroller SCI ports. This serves as a backup method of communication if USB or Bluetooth is not available.

Figure 5:
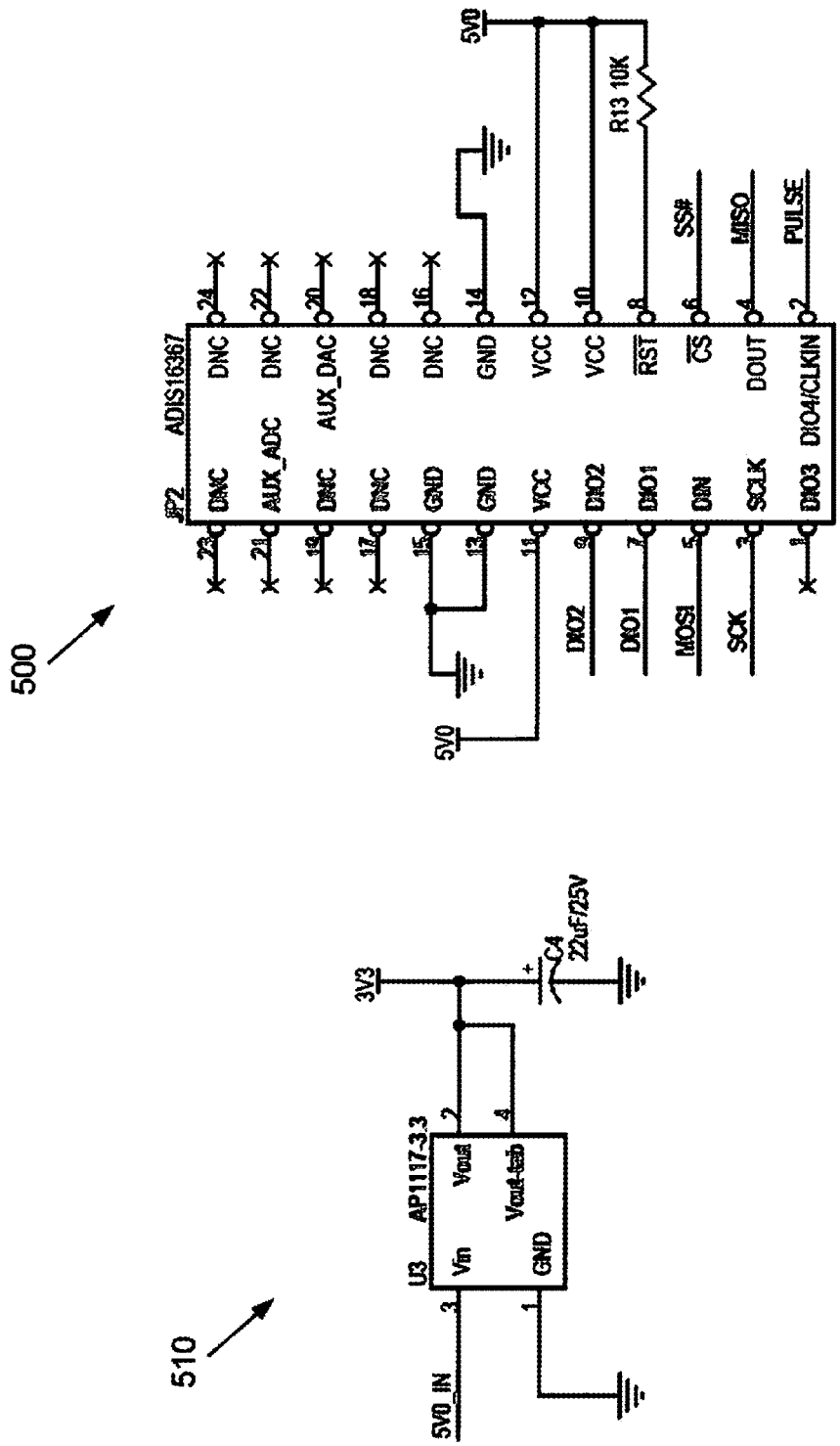
FIG. 5 illustrates a circuit schematic of an IMU and supplemental power regulation, according to an embodiment of the present invention.

FIG. 5 illustrates a circuit schematic of an IMU 500 and supplemental power regulation 510, according to an embodiment of the present invention. The majority of the IMU pins connect directly to ports on the microcontroller. The SCK (serial clock), SS# (inverted slave select), MOSI (master out, slave in), and MISO (master in, slave out) lines all relate to the SPI communication interface. The PULSE line provides a trigger to the IMU to reset the sampling. This signal can be aligned with the external 1 PPS signal, or the PULSE line can be generated by the microcontroller. During testing of some embodiments, the PULSE line was triggered in firmware at 500 Hz, and the microcontroller was triggered by a GPS receiver 1 PPS output (1 Hz). In this case, the local oscillator typically may need to be stable between 1 PPS updates.

Figure 6:
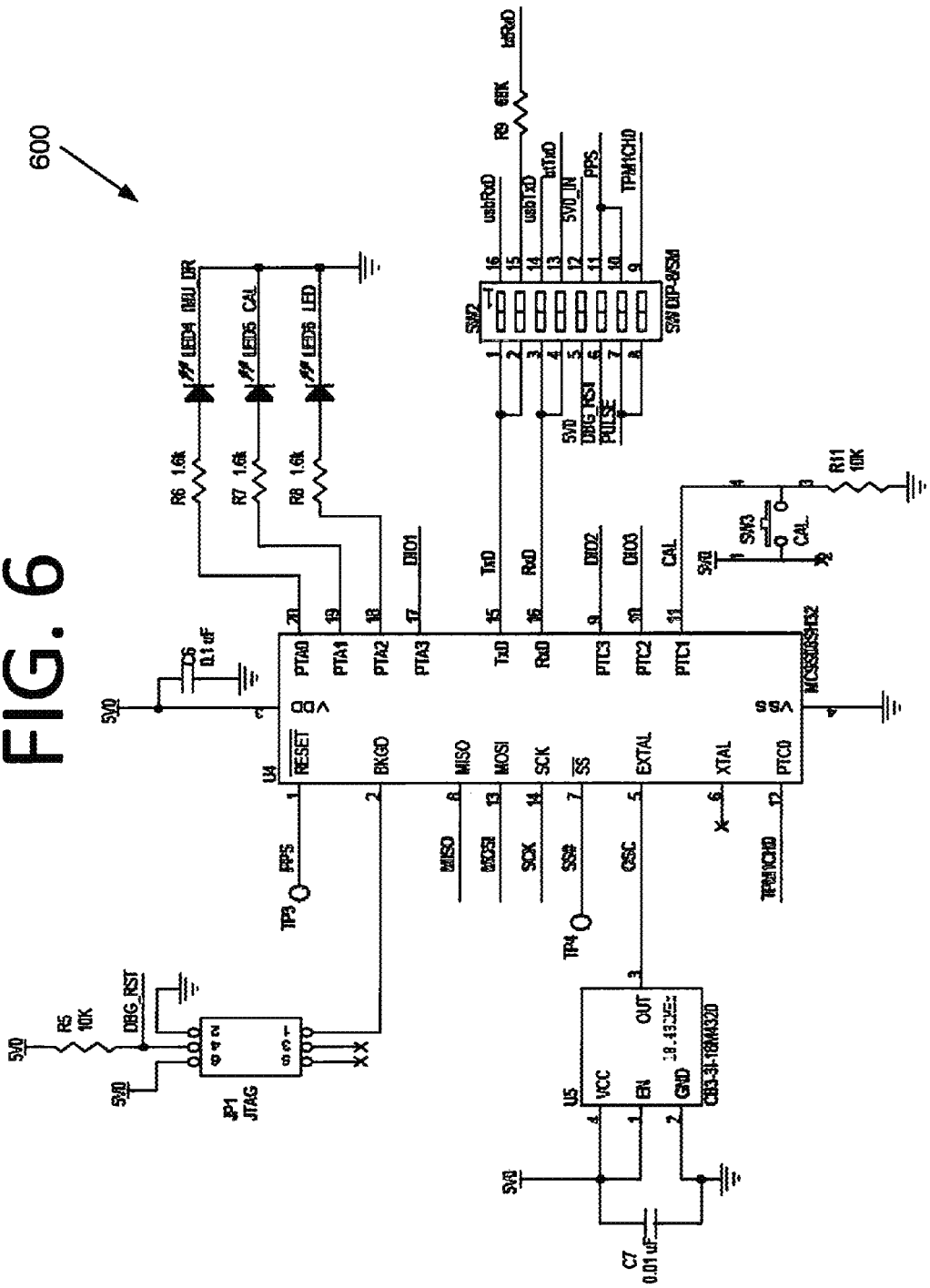
FIG. 6 illustrates a circuit schematic of a microcontroller and supporting hardware, according to an embodiment of the present invention.

FIG. 6 illustrates a circuit schematic of a microcontroller and supporting hardware 600, according to an embodiment of the present invention. Interface JP1 is supplied for in-circuit programming. External oscillator U5 drives the microcontroller bus and core clocks. SW2 is a switch that provides a number of configuration and communication options, which are summarized in Table 1 below. The microcontroller RESET line also serves as an external interrupt request (IRQ) input. The IRQ line is used for an external 1 PPS signal in many embodiments.

TABLE 1

SW2 FUNCTIONS

| Switch Position | | | | | | | | |
|---|---|---|---|---|---|---|---|---|
| 1 | 2 | 3 | 4 | 5 | 6 | 7 | 8 | Function |
| on | off | on | off | off | — | — | — | Enables output from the USB interface module |
| off | on | off | on | on | — | — | — | Enables output from the Bluetooth interface module |
| — | — | — | — | — | on | off | — | Enables RESET line, used for programming |
| — | — | — | — | — | off | on | off | Provides 1 PPS synchronization pulse directly to IMU |
| — | — | — | — | — | off | off | on | Provides firmware synchronization pulse to IMU |

A dash (-) indicates that the switch position does not affect the respective function.

Firmware

In some embodiments, the microcontroller firmware may be coded in C or assembly due to the relatively small code size as compared to many object-oriented programming languages; however, any desired programming language could be used. In an embodiment coded in C, the source code is 600 lines, including a 170-line IMU calibration and configuration sequence. The code in this embodiment utilizes 825 bytes in memory, plus a 7-byte data section. The primary subroutines and configuration settings are reviewed in this section for this embodiment, but it is understood that other suitable subroutines and/or configurations may be used.

The source code in this embodiment contains SPI commands, which are sent from the microcontroller to the IMU, consisting of 16-bit addresses in reverse-byte order. For example, the X gyroscope value may be read by sending "0x04, 0x00" to query the 16-bit register at 0x04. However, SPI is a full-duplex communication protocol, so the response to this request is not seen until the next request is sent. Therefore, a total of 8 commands (2 bytes each) are sent to read 7 registers and obtain X, Y, and Z acceleration and rotation, as well as the X accelerometer temperature.

FIG. 7 illustrates a request and response timing 700 for a communication exchange between an IMU and a microcontroller, according to an embodiment of the present invention. The individual boxes are 16 bits each, however in practice, the request and response is generally made using two consecutive 8-bit data transfers.

Subroutines (Modules)

Example subroutines, or modules, with respect to the C-coded embodiment above are discussed below. These subroutines may have different functionality or not be present at all in other embodiments. Additional subroutines may also be present.

Main: The main subroutine calls all of the initialization routines and periodically polls the push-button switch on PTC1. When the push button switch is activated, the calibrate subroutine is called to calibrate and configure the IMU. All other IMU routines are handled through interrupts.

Calibrate: The calibrate subroutine performs a number of internal tests and configures parameters on the IMU. First, the mechanical self-test routine checks the IMU internal sensors. If mechanical self-test fails, the IMU has been damaged and a "calibrate" LED remains illuminated. The default IMU internal sampling rate may be set to 546 samples per second, for example. Analog filtering and accelerometer compensation flags are set and the data ready (DIO1) output is enabled. The data ready output signal is set logic high when the digital registers of the IMU are updated, triggering a microcontroller read. Finally, the IMU precision automatic bias null calibration procedure samples for around 35 seconds to reduce gyroscope bias. This procedure should be performed with the IMU on a stationary surface.

read_IMU: The read_IMU subroutine transfers rotation, acceleration, and temperature data from the IMU to the navigation processor. The subroutine starts by transmitting a free-running 16-bit internal counter value to the navigation processor as a timestamp, where 1 bit is 0.434 microseconds (μsec). A request is sent for gyroscope X rotation data, but no useful data is generally returned on the first full duplex transaction. The next set of requests for gyroscope-Y and -Z, accelerometer-X, -Y, and -Z, and temperature (twice) data all return valid data points, which are then relayed to the navigation processor. The microcontroller SCI module buffers and transmits the data via a USB or Bluetooth interface, as selected in hardware.

init_GPIO: The init_GPIO subroutine sets up the general-purpose input/output (GPIO) pins on the microcontroller. In particular, PTA0 (1 PPS LED), PTA1 (calibrate LED), and PTA2 (transmit LED) all have high drive strength. PTA0 is toggled every time a GPS 1 PPS signal is received, to indicate that the board is being synchronized to 1 PPS. PTA1 is used exclusively to that the board is in calibration mode and unavailable. PTA2 indicates that the board is transmitting data to the navigation processor. PTA3 receives the IMU DIO1 "data ready" trigger and interrupts into the read_IMU subroutine.

init_chip: The init_chip subroutine causes the RESET pin is set to function as an external IRQ input. The external reference oscillator is selected and the bus is set to use the full frequency (divide-by-1). However, the bus is actually half of the oscillator frequency because it triggers on one edge only.

init_SPI: The init_SPI subroutine configures communication with the IMU. The maximum rate that the IMU will support is 2 MHz, and the SPI clock rate is set to 1.5360 MHz (bus rate, divide-by-6). The slave select (SS#) pin is released for GPIO operation. This is generally required for 16-bit SPI communication.

init_SCI: The init_SCI subroutine sets the USB/Bluetooth data rate as the bus rate divide-by-5 and divide-by-16 for a resulting 115200 baud. The microcontroller uses SCI to transmit data to the navigation processor and receive control characters. An interrupt is generated whenever a byte is received.

init_MOD: The init_MOD subroutine establishes a 40 μsec delay for use between subsequent commands to the IMU in read_IMU.

init_TPM: The init_TPM subroutine sets up two 16-bit counters: TPM1 and TPM2. The first counter, TPM1, generates a sync pulse for the IMU at approximately 500 Hz (+/− 0.025 Hz). Every time the IMU receives this pulse, its digital circuit collects a new sample from the analog sensors. The second counter, TPM2, is a free-running counter with a 0.434 μsec period. The counter overflows every 0.028 seconds, which is enough to timestamp 14 IMU datasets before resetting. This counter is sent to the navigation processor to show the timing between IMU samples in a relative sense.

SWI_ISR: The SWI_ISR interrupt service routine ("ISR") is used to halt the microcontroller when an IMU mechanical failure is detected by the calibrate subroutine.

IRQ_SWR: The IRQ_ISR routine is triggered when a 1 PPS signal (1 Hz) is received from the GPS. When this signal is received, a sync pulse is sent to the IMU to begin data collection. TPM1 is reset and begins to collect data at 500 Hz from the IMU automatically. The microcontroller performs data collection in a mode based on the last received command from the navigation processor.

PTA_ISR: The PTA_ISR routine handles interrupts generated by the IMU DIO3 port that indicate new data is available. The routine determines how many datasets (consisting of gyro-X,-Y,-Z, acceleration-X,-Y,-Z, and temperature) still need to be collected before the next 1 PPS interrupt. The data sent to the navigation processor has a hexadecimal word pre-pended: the first block after the 1 PPS uses "0xBEDE" and subsequent blocks use "0xBEEF". Finally, when no more blocks are remaining before the next 1 PPS, the routine disables the TPM1 sync pulse, which stops the IMU DIO1 that triggers the PTA_ISR subroutine.

SCI_ISR: The SCI_ISR routine receives command bytes from the navigation processor. These command bytes are used by the IRQ_ISR subroutine to decide how to collect data. When 'g' is received ("go"), data is collected and transmitted continuously at 500 Hz. When 'd' is received ("data"), data is collected and transmitted over the next 1 second only. When 'o' is received ("one"), only a single block of data is collected and transmitted. Any other character will disable data collection and transmission as soon as possible.

TPM1_ISR: The TPM1_ISR subroutine sends a sync pulse to the IMU to trigger data collection. Normally this is handled in the timer module. However, this subroutine allows better pulse timing in IRQ_ISR. The automatic method does not synchronize the output pulse to the 1 PPS signal deterministically.

Timing Considerations

The IMU interface board makes tradeoffs to balance IMU design requirements with science objectives. Ideally, a fast sample rate will deliver the best science data. However, practical considerations, including maximum communication speeds (SCI and SPI), IMU sampling rates, and commanding delay restrict the achievable data rates. A sample rate of 500 Hz was selected for testing in some embodiments. The primary IMU rate restrictions for an Analog Devices ADIS16364™ IMU are summarized in Table 2 below.

TABLE 2

PRIMARY DATA RATE RESTRICTIONS OF THE IMU

| Parameter i | Restriction | Description |
| --- | --- | --- |
| $f_{SCLK}$ | Maximum 2.0 MHz rate | Restricts the serial clock rate between the IMU and microcontroller to 2.0 MHz (0.5 μsec) maximum. |
| $t_{readrate}$ | Minimum 40 μsec delay | Restricts the rate of data reads so that there is a minimum of 40 μsec from the start of one register read to the start of the next register read. |
| $t_2$ | Typical 600 μsec delay | Inserts a 600 μsec delay between the capture of analog data due to a sync pulse and the read of the corresponding digital registers by the microcontroller. |

The navigation processor and microcontroller have data rate restrictions due to the 115200-baud communication interface. In order to maintain 500-Hz sampling, a new dataset should be read from the IMU every 2 milliseconds. There is a minimum 40 μsec delay between subsequent register reads, although in practice this is mitigated by transmitting data to the navigation processor (navproc) while waiting. A simplified, theoretical timing breakdown is provided in Table 3 below.

TABLE 3

TIMING BREAKDOWN PER IMU DATASET

| Data Flow | Bytes | Data Rate | Time (μsec) | Description |
| --- | --- | --- | --- | --- |
| To navproc | 2 | 115200 bps | 139 | Dataset header (0xBEEF or 0xBEDE). |
| To navproc | 2 | 115200 bps | 139 | Dataset timestamp from TPM2. |
| To IMU | 16 | 2 Mbps | 640 | IMU register reads for (7 + 1) 16-bit registers, limited by a minimum delay of 40 μsec for each read. |
| To navproc | 14 | 115200 bps | 972 | Dataset values for (7) 16-bit registers from the IMU. |
| — | — | — | 110 | Predicted time margin for each dataset. |

Since the IMU is sampled at 500 Hz, the timing in Table 3 is repeated 500 times per second. The 1 PPS signal provides synchronization to the microcontroller TPM1 timer, and then the TPM1 timer provides sub-second timing to control the IMU sampling rate.

Hardware Traces

The overall hardware timing for the embodiment discussed above is shown in the oscilloscope traces in FIG. 8. 1 PPS signal 810 triggers the start of TPM1 pulse in TPM signal 830, which causes the IMU to sample its analog registers. The TPM1 pulse drops when the IMU issues a 'data ready' interrupt, and the dataset header and timestamp are transmitted via USB. SPI signal 840 is used to poll the IMU registers several times, and each returned value is transmitted immediately over USB, as shown in USB signal 820. This allows the system to efficiently meet the 40 μsec minimum delay between register reads.

Figure 8:
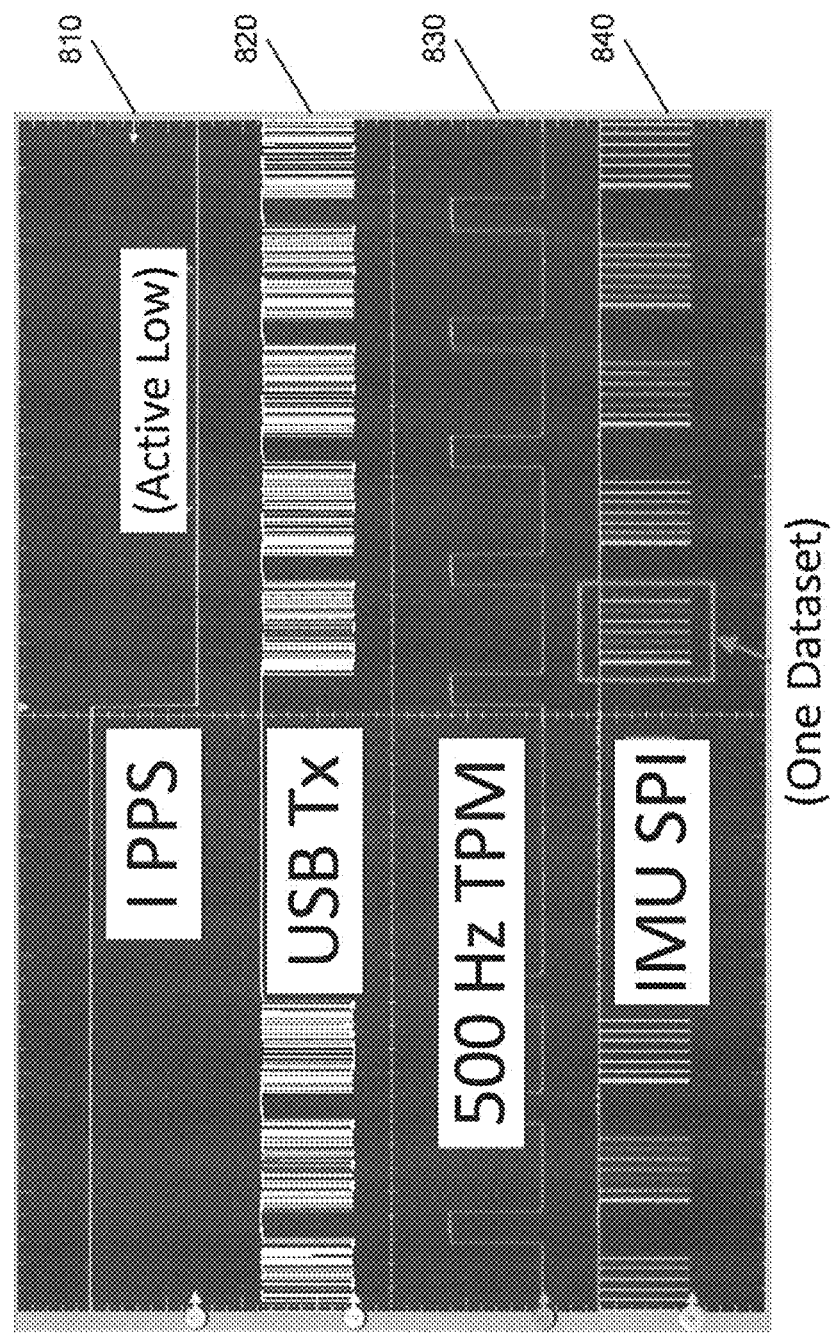
FIG. 8 is a timing diagram illustrating oscilloscope traces of overall hardware timing, according to an embodiment of the present invention.

The traces in FIG. 8 show both the beginning of the current sample set and the end of the previous sample set. The registers are sampled 500 times per second, with a delay between the time when the samples are collected by the IMU registers and when the samples are available to the microcontroller. Therefore, either the individual sample periods should have sufficient margin to account for this delay, or the overall sample rate should be accelerated slightly to ensure that the previous sample set does not overflow into the next. The sampling rate in FIG. 8 provides a margin of about 4 milliseconds to account for any delays.

The 4-millisecond margin provides a buffer against oscillator drift. As the timing constraints of the individual datasets get tighter (i.e., faster sampling), there is greater risk that drift will create a communication backlog or periodic errors. Providing a significant margin at the end of the sampling cycle reduces the chances that drift will disrupt the 1 PPS synchronization.

Figure 9:
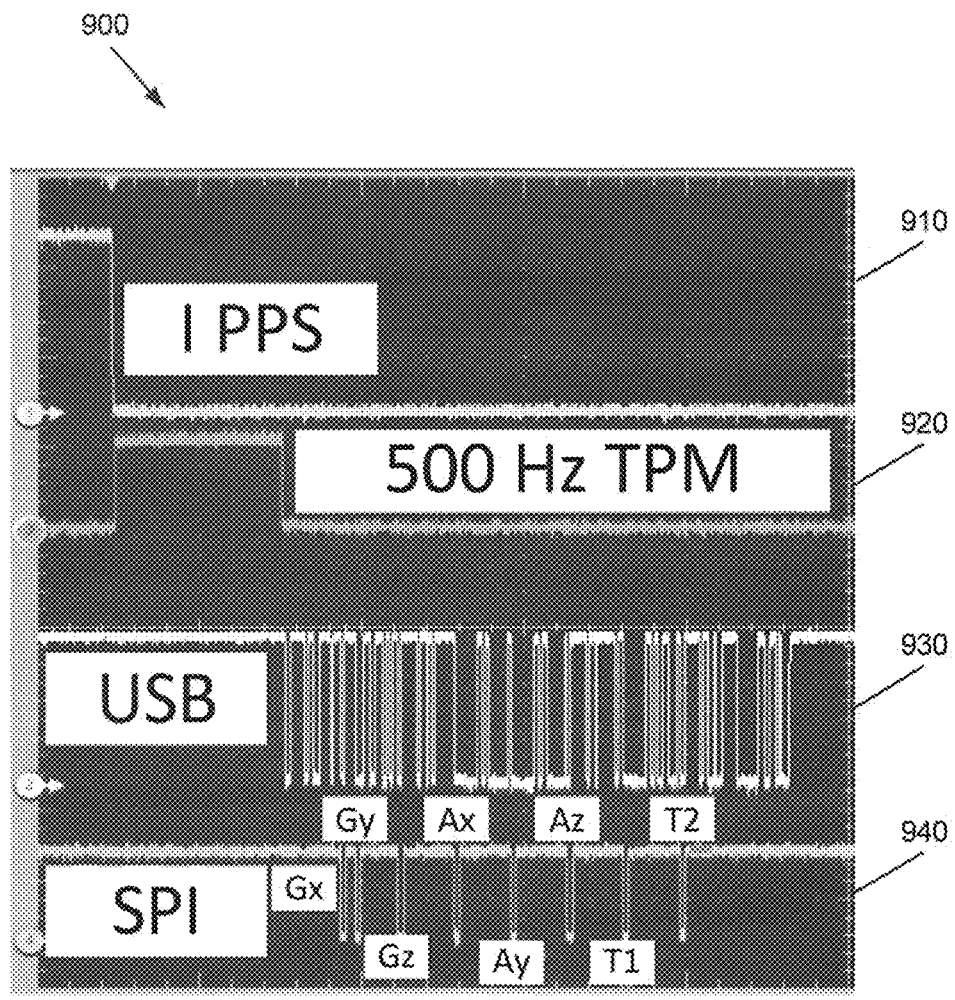
FIG. 9 is a timing diagram illustrating oscilloscope traces of an example of single dataset hardware timing, according to an embodiment of the present invention.

The traces 900 in FIG. 9 examine a single dataset. As with FIG. 8, a 1 PPS signal 910, a USB signal 920, and a TPM signal 930 are shown. Each IMU SPI block of SPI signal 940 contains the 7 values of interest: gyroscope (Gx, Gy, Gz), accelerometer (Ax, Ay, Az), and temperature (T). There is minimal (40 µsec) delay after Gx because the returned data is not valid. The Gx data is returned on the Gy request. Similarly, T should be requested twice (T1, T2) since the correct value is returned at T2.

Figure 10:
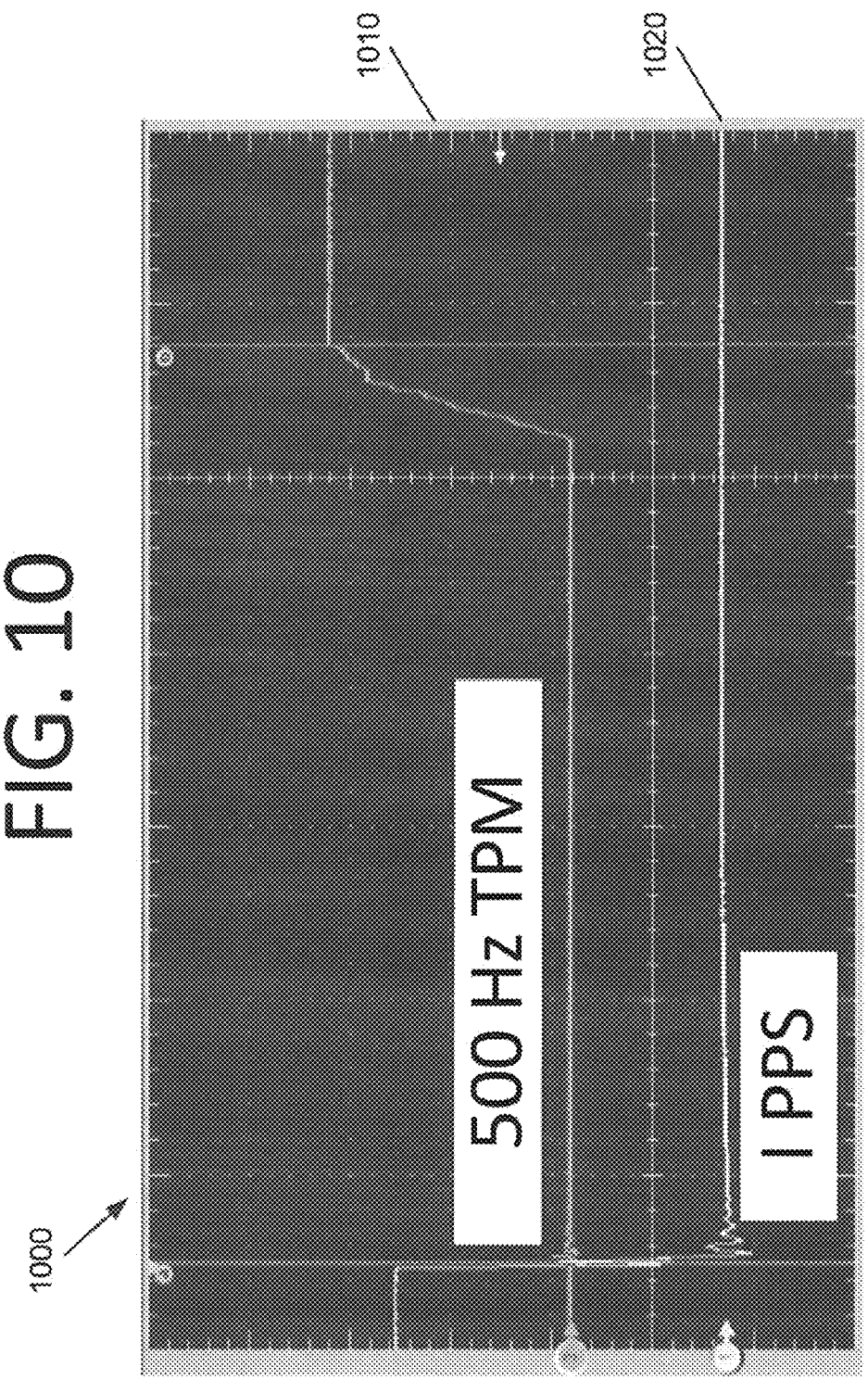
FIG. 10 is a timing diagram illustrating an average hardware timing of a 1 PPS to TPM1 trigger across 50 samples, according to an embodiment of the present invention.
Figure 11:
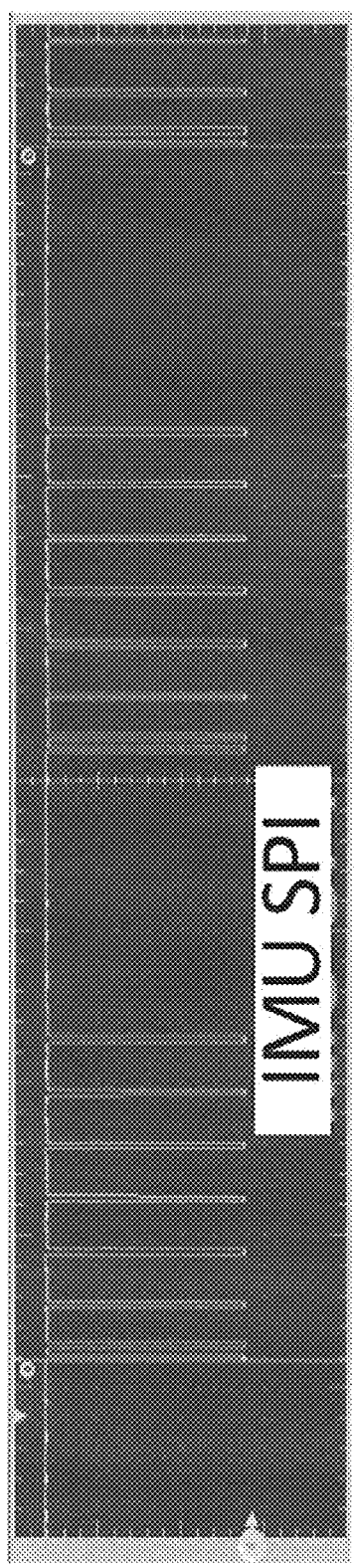
FIG. 11 is a timing diagram illustrating hardware timing at a 500 Hz sampling rate, according to an embodiment of the present invention.

In order to make IMU datasets useful for post-processing, the timing should be synchronized with other sensors and system components. An average hardware timing 1000 of a 1 PPS to TPM1 trigger across 50 samples is shown in FIG. 10, which demonstrates that the response time does vary slightly between subsequent sample sets. TPM signal 1010 and 1 PPM signal 1020 are shown. The worst case response was 5.26 µsec, the best case was 4.72 µsec, and on average, the interface responded in 4.99 µsec.

According to the datasheet for the Analog Devices ADIS16364™ IMU, the $t_2$ delay between the TPM1 trigger and the data ready interrupt is typically 600 µsec. In practice, this was found to be around 520 µsec for the particular IMU in use. The timestamp sent to the navigation processor is delayed the same duration. In theory, the IMU samples all of its analog sensors simultaneously on the rising edge of TPM1 pulse 1010. Therefore, the sensor values are collected approximately 5 µsec after the 1 PPS pulse and assigned a timestamp 518 µsec later. The timestamp can be adjusted by negative 523 µsec to determine the 1 PPS epoch.

The 500 Hz timing is verified in hardware timing 1100 of FIG. 13. The time step between three datasets is 4.0 msec (250 Hz), yielding a 500 Hz average sample rate between each dataset. Timing variations between subsequent datasets are tracked by the TPM2 timestamp. Also, there is a sufficient margin prior to the next 1 PPS pulse to allow for small amounts of drift (approximately 0.2% to 0.4%).

Figure 12:
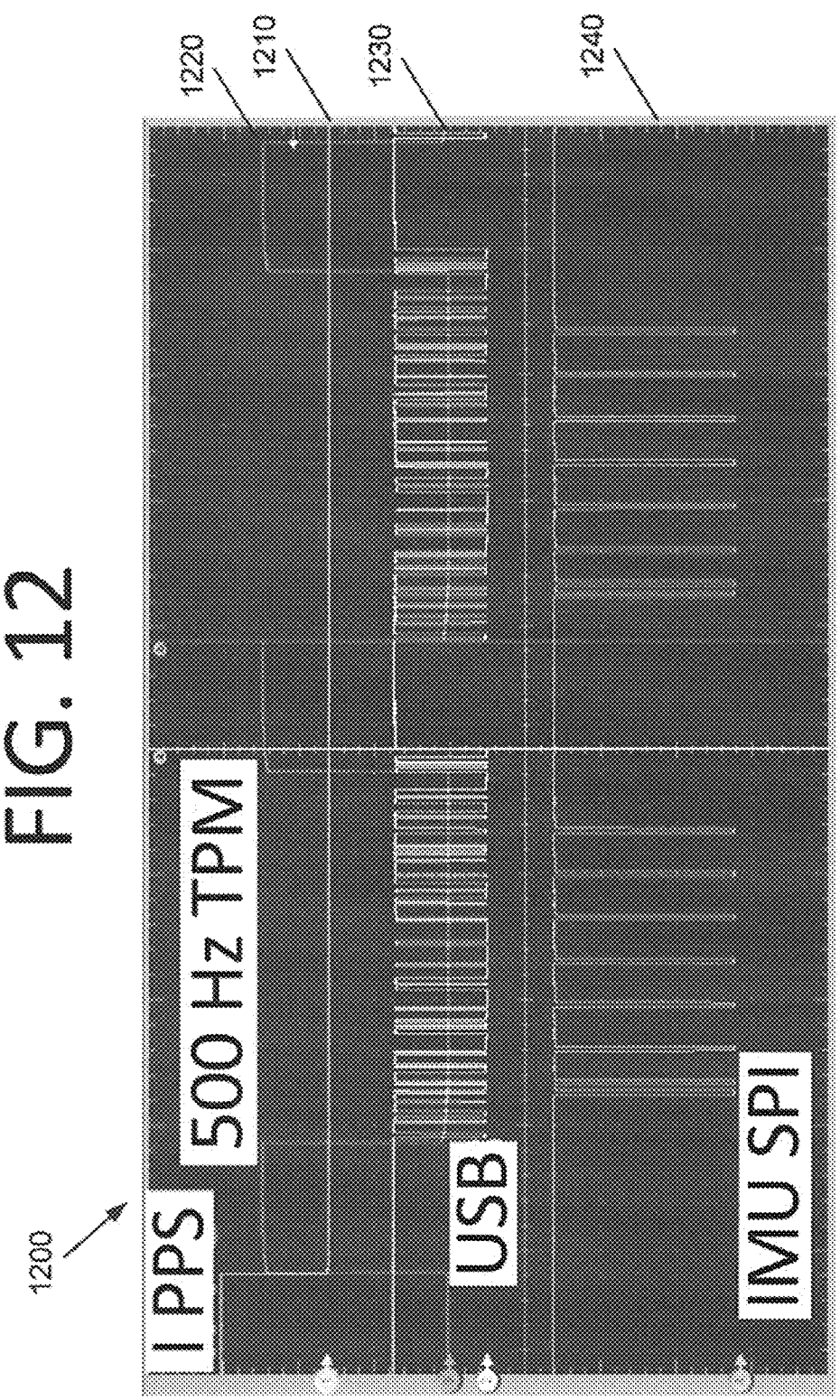
FIG. 12 is a timing diagram illustrating hardware inter-dataset timing margins, according to an embodiment of the present invention.

The actual inter-dataset timing margin, 435 µsec, is shown in FIG. 12. In Table 3 the simplified margin was predicted to be 110 µsec. However, hardware parallelism significantly increases the margin. The microcontroller provides buffering and parallel operation for the USB transmission, which eliminates the time cost of SPI reads. This saves 40 µsec per each of 8 reads, or about 320 µsec.

The majority of hardware timing constraints are due to communications delays. There are other unaccounted factors, such as instruction execution time, which will provide only minimally affect the dataset timing and are not considered here. The individual dataset timing margin, 435 µsec, would allow transmission of an extra 6 bytes of data to the navigation processor without significant impact. Or, system sampling could be increased to 638 Hz without reducing the dataset.

Some embodiments of the present invention pertain to a microcontroller interface board for an Analog Devices ADIS16364™ IMU. However, other embodiments may be adapted for other boards, as would be understood by one of ordinary skill in the art. The board discussed above supports sampling at 500 Hz with synchronization to a 1 PPS pulse with 5 µsec delay on average. The microcontroller firmware is adaptable to similar Analog Devices IMUS and can be modified to accommodate different timing schemes. The circuit provides selectable communication between either the USB or Bluetooth modules at 115200 baud.

The interface board of some embodiments of the present invention addresses two important issues: synchronization and data corruption. Synchronization is resolved through the external 1 PPS trigger, which allows all elements of the system to be synchronized to the same pulse. Data corruption primarily is solved through use of an external oscillator that allows the sampling rate and communications rates to be held relatively constant despite temperature change. These enhancements make it easier to include the board in an overall navigation system with other sensors.

It should be noted that some of the subroutines described in this specification have been presented as modules, in order to more particularly emphasize their implementation independence. For example, a module may be implemented as a hardware circuit comprising custom very large scale integration ("VLSI") circuits or gate arrays, off-the-shelf semiconductors such as logic chips, transistors, or other discrete components. A module may also be implemented in programmable hardware devices such as field programmable gate arrays, programmable array logic, programmable logic devices, graphics processing units, or the like.

A module may also be at least partially implemented in software for execution by various types of processors. An identified unit of executable code may, for instance, comprise one or more physical or logical blocks of computer instructions that may, for instance, be organized as an object, procedure, or function. Nevertheless, the executables of an identified module need not be physically located together, but may comprise disparate instructions stored in different locations which, when joined logically together, comprise the module and achieve the stated purpose for the module. Further, modules may be stored on a computer-readable medium, which may be, for instance, a hard disk drive, flash device, random access memory ("RAM"), tape, or any other such medium used to store data.

Indeed, a module of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

It will be readily understood that the components of various embodiments of the present invention, as generally described and illustrated in the figures herein, may be arranged and designed in a wide variety of different configurations. Thus, the detailed description of the embodiments of the systems, apparatuses, methods, and computer programs of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. An apparatus, comprising:
a circuit board configured to serve as a control and sampling interface between an inertial measurement device, a local oscillator, and an external trigger pulse, the circuit board configured to:
receive the external trigger pulse and time align the local oscillator to initiate sampling of the inertial measurement device for data at precise time intervals based on pulses from the local oscillator, wherein
the sampled data is synchronized by the circuit board with a navigation system via the external trigger pulse.

2. The apparatus of claim 1, wherein the circuit board is further configured to collect a plurality of inertial measurements from the inertial measurement device between external trigger pulses.

3. The apparatus of claim 1, wherein the circuit board is further configured to receive a radiometric trigger pulse from a radiometric device and synchronize sampling of the inertial measurement device with the radiometric device.

4. The apparatus of claim 3, wherein the circuit board is further configured to sample the inertial measurement device based on the external trigger pulse when the radiometric trigger pulse from the radiometric device is not received.

5. The apparatus of claim 1, wherein the data sampled from the inertial measurement device comprises delta angle along an X, Y, and Z axis measured by a gyroscope and delta velocity along the X, Y, and Z axis measured by an accelerometer.

6. The apparatus of claim 1, wherein the external trigger pulse is generated externally to the circuit board and transmitted wirelessly to the circuit board.

7. The apparatus of claim 1, wherein the circuit board is further configured to minimally process the sampled data onboard and to provide the minimally processed data to the navigation system for inclusion in the overall system.

8. The apparatus of claim 1, wherein the circuit board is further configured to cause normal time stamping overhead associated with data collection by the inertial measurement device to be performed outside of a main processor of the navigation system, freeing up processing resources to run more intensive algorithms in parallel.

9. An apparatus, comprising:
a circuit board configured to serve as a control and sampling interface between with an inertial measurement device, a local oscillator, and an external trigger pulse, the circuit board configured to:
receive the external trigger pulse and time align the local oscillator, and
sample the inertial measurement device for data at time intervals based on pulses from the oscillator.

10. The apparatus of claim 9, wherein the circuit board is further configured to collect a plurality of inertial measurements from the inertial measurement device between external trigger pulses.

11. The apparatus of claim 9, wherein the circuit board is further configured to receive a radiometric trigger pulse from a radiometric device and synchronize sampling of the inertial measurement device with the radiometric device.

12. The apparatus of claim 11, wherein the circuit board is further configured to sample the inertial measurement device based on the external trigger pulse when the radiometric trigger pulse from the radiometric device is not received.

13. The apparatus of claim 9, wherein the data sampled from the inertial measurement device comprises delta angle along an X, Y, and Z axis measured by a gyroscope and delta velocity along the X, Y, and Z axis measured by an accelerometer.

14. The apparatus of claim 9, wherein the circuit board is further configured to minimally process the sampled data onboard and to provide the minimally processed data to a navigation system for inclusion in the overall system.

15. The apparatus of claim 9, wherein the circuit board is further configured to cause normal time stamping overhead associated with data collection by the inertial measurement device to be performed outside of a main processor of a navigation system, freeing up processing resources to run more intensive algorithms in parallel.

16. A system, comprising:
an inertial measurement unit;
a local oscillator;
a main processor; and
a circuit board configured to serve as a control and sampling interface between with the inertial measurement unit, the local oscillator, an external trigger pulse, and the main processor, the circuit board configured to:
receive the external trigger pulse and time aligns the local oscillator, and
sample the inertial measurement device for data at time intervals based on pulses from the oscillator, wherein
the sampled data is synchronized by the circuit board with a navigation system via the trigger pulse, and
the main processor is configured to perform intensive processing for the navigation system.

17. The system of claim 16, wherein the circuit board is further configured to collect a plurality of inertial measurements from the inertial measurement device between external trigger pulses.

18. The system of claim 16, wherein the circuit board is further configured to receive a radiometric trigger pulse from a radiometric device and synchronize sampling of the inertial measurement device with the radiometric device.

19. The system of claim 16, wherein the circuit board is configured to minimally process the sampled data onboard and to provide the minimally processed data to the navigation system for inclusion in the overall system.

20. The system of claim 16, wherein the circuit board is further configured to cause normal time stamping overhead associated with data collection by the inertial measurement device to be performed outside of the main processor of the navigation system, freeing up processing resources to run more intensive algorithms in parallel.

\* \* \* \* \*